United States Patent
Chen et al.

(10) Patent No.: US 11,379,014 B2
(45) Date of Patent: Jul. 5, 2022

(54) HINGE ASSEMBLIES

(71) Applicant: Hewlett-Packard Development Company, L.P., Spring, TX (US)

(72) Inventors: Wei-Chung Chen, Taipei (TW); Kuan-Ting Wu, Taipei (TW)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 16/980,868

(22) PCT Filed: Mar. 16, 2018

(86) PCT No.: PCT/US2018/022931
§ 371 (c)(1),
(2) Date: Sep. 15, 2020

(87) PCT Pub. No.: WO2019/177622
PCT Pub. Date: Sep. 19, 2019

(65) Prior Publication Data
US 2021/0011526 A1 Jan. 14, 2021

(51) Int. Cl.
*H05K 5/00* (2006.01)
*G06F 1/16* (2006.01)
*H05K 5/02* (2006.01)

(52) U.S. Cl.
CPC .......... *G06F 1/1681* (2013.01); *G06F 1/1662* (2013.01); *H05K 5/0226* (2013.01)

(58) Field of Classification Search
None
See application file for complete search history.

(56) References Cited

U.S. PATENT DOCUMENTS

| | | | |
|---|---|---|---|
| 6,561,333 B2 | 5/2003 | Larson et al. | |
| 8,776,319 B1 | 7/2014 | Chang et al. | |
| 9,411,365 B1 * | 8/2016 | Tanner | G06F 1/1681 |
| 9,624,703 B1 | 4/2017 | Lin | |
| 10,747,277 B2 * | 8/2020 | Ku | H05K 7/20145 |
| 2002/0075647 A1 * | 6/2002 | DiFonzo | H05K 7/20172 361/679.48 |
| 2011/0091051 A1 * | 4/2011 | Thomason | G06F 1/1616 381/103 |
| 2012/0124775 A1 * | 5/2012 | Ceci | G06F 1/1681 16/342 |
| 2015/0173219 A1 | 6/2015 | Hale | |
| 2017/0183895 A1 | 6/2017 | Chen et al. | |
| 2018/0058793 A1 * | 3/2018 | Tarazi | F41C 33/001 |
| 2020/0409430 A1 * | 12/2020 | Wu | G06F 1/1616 |
| 2021/0048853 A1 * | 2/2021 | Chen | E05D 3/122 |
| 2021/0103317 A1 * | 4/2021 | Raju | G06F 1/1618 |

OTHER PUBLICATIONS

Common Torque Engine Technologies, http://www.frictionhinge.com/tech.html, Dec. 27, 2017.

* cited by examiner

*Primary Examiner* — Anthony Q Edwards
*Assistant Examiner* — Rashen E Morrison
(74) *Attorney, Agent, or Firm* — Lakshmi Kumaran & Sridharan

(57) ABSTRACT

Examples of hinge assemblies are described. In an example, a hinge assembly includes a first hinge element having a first shaft, a second hinge element having a second shaft, and a clip coupling the first shaft to the second shaft. The clip includes a first portion formed of c a composite material and a second portion formed of a metal.

12 Claims, 5 Drawing Sheets

HINGE ASSEMBLIES

BACKGROUND

Devices, such as laptops, may be manufactured to be compact and portable. The devices may have hinge assemblies or joints that allow a component of the device, such as a cover unit, to fold over another component of the device, such as a base unit.

BRIEF DESCRIPTION OF THE DRAWINGS

The following detailed description references the drawings, wherein.

DETAILED DESCRIPTION

Figure 1:
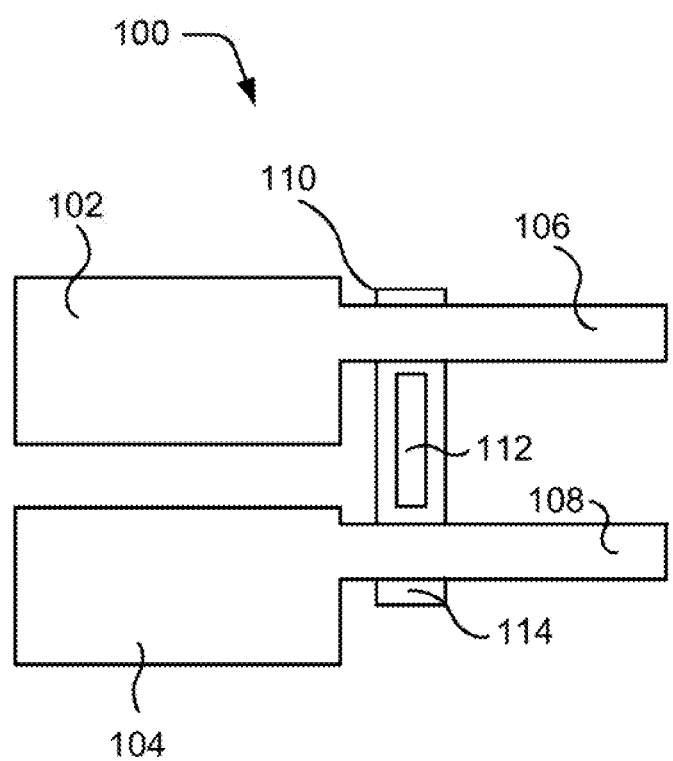
FIG. 1 illustrates a schematic block diagram of a hinge assembly, in accordance with an example.

Electronic devices, such as laptops, smartphones, personal digital assistants (PDAs), or the like, may have foldable components. An electronic device may have a cover unit which houses a display panel or other output components for rendering visual content, and a base unit to hold input components, such as a keyboard, trackpad touch surface, memory, and/or other components or electronic circuitry. In an example, the output component and/or the input components may be housed in a single unit, such as the base unit, and the cover unit may act as a lid which may overlay on the base unit. The cover unit may be coupled to the base unit through a hinge assembly which enables movement of the cover unit with respect to the base unit or vice versa.

The hinge assembly may include two hinge elements. One hinge element may be coupled to the base unit and another hinge element may be coupled to the display unit. The two hinge elements may include respective shafts. The respective shafts of the hinge elements are generally coupled to each other by a clip which has openings for passage of the shafts. The respective shafts can rotate within these openings about their respective axes to enable folding and unfolding of the hinge assembly.

Generally, during folding and unfolding of the hinge assembly, when the shafts rotate within the openings of the clip, frictional forces may develop at interacting surfaces of the shafts and the clip which results in generation of heat. The heat may not be dissipated adequately leading to overheating which may cause wear and tear of the clip. Further, when the hinge assembly is subjected to a high torque, the friction may be more, which may increase the heat generation and the consequent wear and tear of the clip. Thus, cracks may be formed in the clip, which may lead to breakage of the clip.

The present subject matter describes a hinge assembly in which a clip that couples shafts of the hinge elements is formed of a composite material, e.g., a carbon fiber reinforced aluminum and a metal. Since the clip is formed of the composite material, the clip has a better thermal conductivity and better heat dissipation properties which enable the heat generated during operation of the hinge assembly to effectively distribute and thereby reduce wear and tear of the clip.

In an example, the present subject matter describes a hinge assembly having a first hinge element and a second hinge element. Each of the first and second hinge elements has a respective shaft. The hinge assembly includes a clip coupling the respective shafts, where the clip includes a first portion formed of a composite material and a second portion formed of a metal.

The clip having the first portion formed of the composite material and the second portion formed of the metal has increased thermal conductivity and enhanced tensile strength, as compared to clips formed of a single material which are generally used in hinge assemblies. Thus, the clip of the present subject matter is more durable against mechanical stress. Further, the clip formed of the composite material and metal portions is also light weight as compared to clips formed of single material.

The above described implementations are further elaborated with reference to the Figures. It should be noted that the description and figures merely illustrate the principles of the present subject matter along with examples described herein and, should not be construed as a limitation to the present subject matter. It is thus noted that various arrangements may be devised that, although not explicitly described or shown herein, describe the principles of the present subject matter. Moreover, all statements herein reciting principles, aspects, and examples of the present subject matter, as well as specific examples thereof, are intended to encompass equivalents thereof.

FIG. 1 illustrates a schematic block diagram of a hinge assembly 100, in accordance with an example. In an example, the hinge assembly 100 can couple cover unit and a base unit of an electronic device, such as a laptop, a foldable tablet, a personal digital assistant (PDA), a foldable e-reader, or the like.

100 FIG. 1 shows a cross-sectional view of the hinge assembly 100. The hinge assembly 100 includes a first hinge element 102 and a second hinge element 104. In an example, the first and second hinge elements 102 and 104 are movable components of the hinge assembly 100 which can be moved relative to one another to fold or unfold the hinge assembly. In an example, the first and second hinge elements 102 and 104 may be referred to as brackets of the hinge assembly 100.

The first hinge element 102 includes a first shaft 106. In an example, a shaft may be a rotatable element that enables folding and unfolding of the hinge assembly. In an example, the first shaft 106 is a rod-shaped element that may rotate about its longitudinal axis. The second hinge element 104 includes a second shaft 108. The second shaft 108 has a similar structure and function as that of the first shaft 106. Although in FIG. 1, the first and the second shafts 106 and 108 may have a circular cross-section, in an example, the first and second shafts 106 and 108 may have any other cross-sectional profile, such as an ellipse, an oblong, a square, a triangle, etc.

The hinge assembly 100 further includes a clip 110 coupling the first shaft 106 to the second shaft 108. In an example, a clip may be a coupling element having openings for passing the shafts of the hinge assembly 100. The openings of the clip may allow the shafts to rotate about their respective axes relative to the clip 110 during folding and unfolding of the hinge assembly 100. The clip 110 includes a first portion 112 formed of a composite material, which, in some examples, may be a carbon fiber reinforced aluminum, and a second portion 114 formed of a metal. In an example, the carbon fiber reinforced aluminum of the first portion 112 may include an aluminum matrix with carbon fiber dispersed on the aluminum matrix. In an example, the metal forming the second portion 114 includes steel, such as SK5, SK7, SUS420. In an example, the clip 110 may be formed by a molding process, In the clip 110, the arrangement of the metallic second portion 114, having a greater hardness, encapsulating the first portion 112, having a comparatively lower hardness than the second portion 114, may enable a reduction of stiffness of the clip 110. The clip 110 having reduced stiffness may be more flexible and thereby less prone to breakage.

Figure 2A:
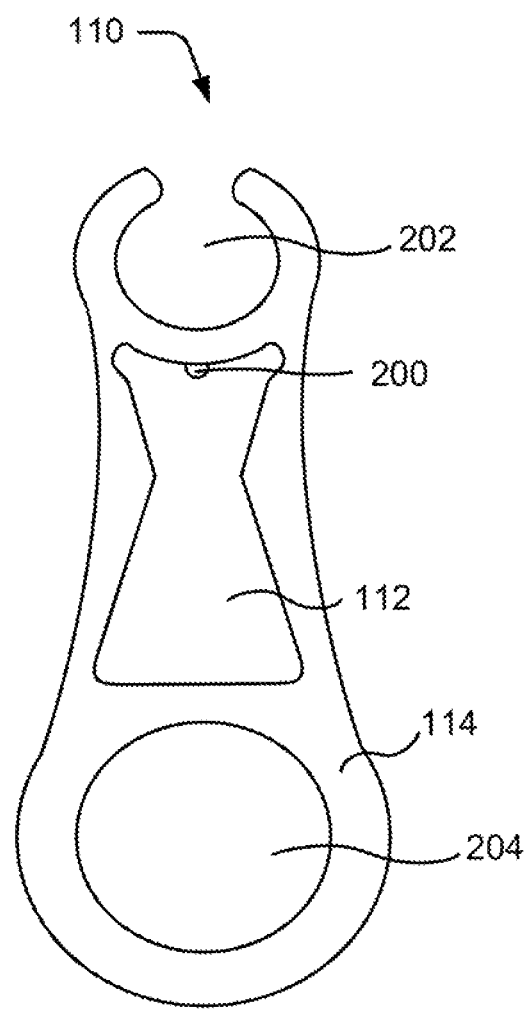
FIG. 2a illustrates a schematic representation of a clip of the hinge assembly, in accordance with an example.

FIG. 2a illustrates a schematic representation of the clip 110 of the hinge assembly 100, in accordance with an example. In an example, the clip 110 has a density ranging between 2.5 gram per cubic centimeter ($g/cm^3$) and 2.6 $g/cm^3$, a thermal conductivity ranging between 800 watts per meter-kelvin (W/mK) and 820 W/mK, and a tensile strength ranging between 5,000 millipascal (mpa) and 7,000 mpa.

In the clip 110, shown in FIG. 2a, the first portion 112 is bounded by the second portion 114, such that the first portion 112 forms an inner part of the clip 110 and the second portion 114 forms an outer part of the clip 110. The second portion 114 of the clip 110 includes a first opening 202 and a second opening 204. The first and second openings 202 and 204 are holes, windows, apertures, or other types of openings formed in the clip 110 which can bear the first and second shafts 106 and 108, respectively. In an example, the first and second openings 202 and 204 may have different shapes, such as an ellipse, an oblong, a square, a triangle, or the like, corresponding to the cross-sectional profile of the first and second shafts 106 and 108. In other examples, the first portion 112 may be partially bounded by the second portion 114, for example, the first portion 112 may form an intermediate portion disposed in between the first opening 202 and the second opening 204.

In an example, the first shaft 106 passes through the first opening 202 and the second shaft 108 passes through the second opening 204. When the hinge assembly 100 is folded and unfolded, the first shaft 106 may rotate within the first opening 202 and the second shaft 108 may rotate within the second opening 204.

The clip 110 includes an air passage 200, The air passage 200 may be a pore or a cavity formed in a body of the clip 110. The air passage 200 is bounded by the first portion 112 and the second portion 114. The air passage 200 shown in FIG. 2a, may be obtained by forming a semicircular cavity in the first portion 112 at a periphery of the first portion 112, such that the air passage 200, on being formed, is bound by the first portion 112 and the second portion 114. Although in FIG. 2a, the air passage 200 is shown to have a semicircular shape, in an example, the air passage may have other shapes, such as a sphere, an ellipsoid, an oblong, or other similar shapes. Further, although in FIG. 2a the air passage 200 is shown to be formed in the first portion 112, in an example, the air passage 200 ay be formed at a periphery of the second portion 114 facing the first portion 112 and may be bounded by the first portion 112 and the second portion 114. In another example, the air passage may be formed partly in the first portion 112 and partly in the second portion 114 and may be bounded by the first portion 112 and the second portion 114. In an example, the air passage 200 of FIG. 2a, may have a diameter ranging between 0.5 mm to 1 mm.

When the hinge assembly 100 is folded or unfolded, the first and second shafts 106 and 108 may rotate within the first and second openings 202 and 204, respectively. Due to rotation of the first and second shafts 106 and 108, a pressure may be exerted on the clip 110. Air contained in the air passage 200 may absorb the pressure exerted by the first and second shafts 106 and 108 on the clip 110. Thus, the air passage 200 may provide better cushioning to the clip 110 thereby reducing wear and tear of the clip 110 and increasing its longevity. Further, when the shafts are rotated, due to friction between the first and second shafts 106 and 108 and respective interacting surfaces of the first and second openings 202 and 204, heat may be generated at the interacting surfaces. The air passage 200 may also facilitate better dissipation of this heat, thereby enabling cooling of the interacting surfaces of the clip 110 and the first and second shafts 106 and 108.

Figure 2B:
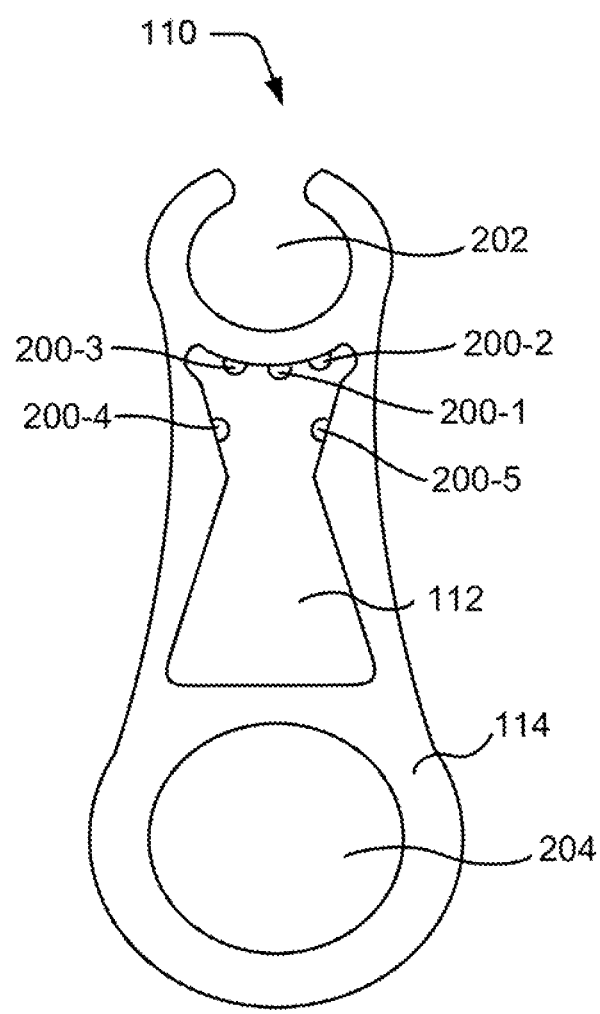
FIG. 2b illustrates a schematic representation of the clip of the hinge assembly, in accordance with an example.

FIG. 2b illustrates a schematic representation of the clip 110 of the hinge assembly 100, in accordance with an example. As shown in FIG. 2b, the clip 110 includes air passages 200-1 to 200-5. Although, FIG. 2b shows five air passages formed in the first portion 112 of the clip 110, in an example, the clip 110 may include more than five or less than five air passages.

Figure 3:
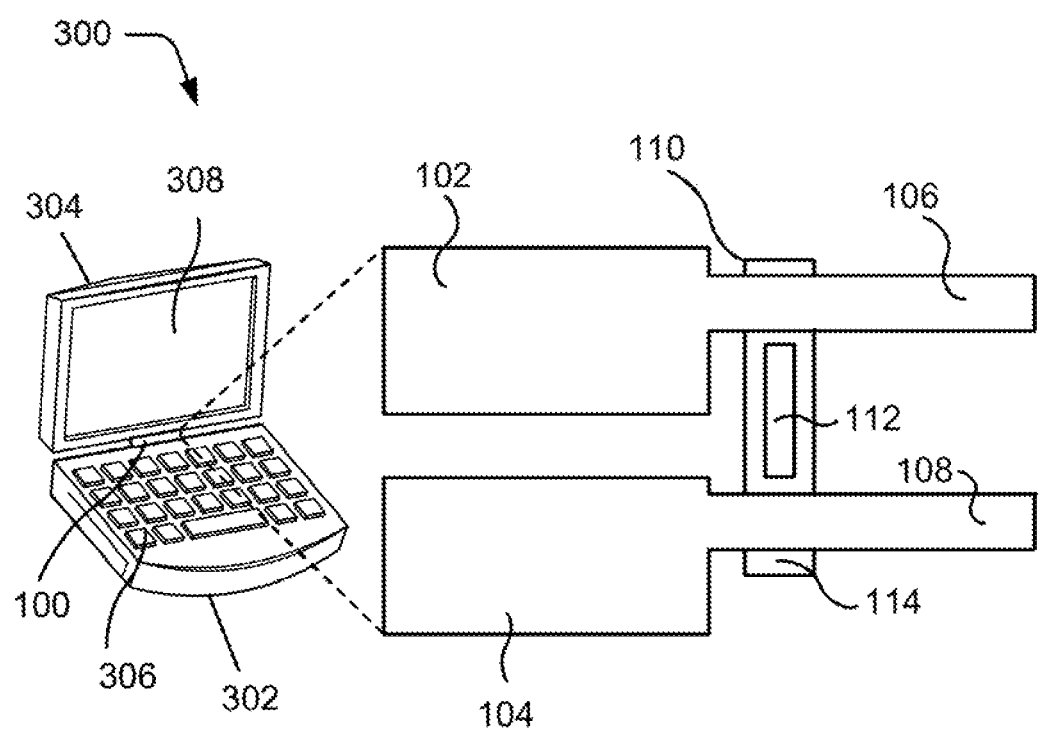
FIG. 3 illustrates a schematic representation of a device with a hinge assembly, in accordance with an example.

FIG. 3 illustrates a schematic representation of a device 300 with the hinge assembly 100, in accordance with an example. Examples of the device 300 include an electronic device, such as a laptop, a foldable tablet, a personal digital assistant (PDA), a foldable e-reader, or the like.

The device 300 includes a base unit 302 and a cover unit 304. In an example, the base unit 302 houses a keyboard 306 or other input component, and other electronic components of the device 300. The cover unit 304 houses a display panel 308 for rendering visual content, or other output component. In an example, the display panel 308 may be a touch-based display panel capable of receiving touch-based user inputs.

The device 300 includes the hinge assembly 100 coupling the cover unit 304 to the base unit 302. The hinge assembly 100 may be connected between the cover unit 304 and the base unit 302 through screws or other mechanical fasteners. In an example, the first hinge element 102 is coupled to the cover unit 304 and the second hinge element 104 is coupled to the base unit 302. In an example, the first hinge element 102 may be coupled to the cover unit 304 through screws passing through the first hinge element 102 and into the cover unit 304, or a portion thereof. In an example, the second hinge element 104 may be coupled to the base unit 302 through screws passing through the second hinge element 104 and into the base unit 302, or a portion thereof. In the clip 110 of FIG. 3, the first portion 112 is formed from a composite material, such as carbon fiber reinforced aluminum and the second portion 114 is formed from a metal. As shown in FIG. 3, the first portion 112 is bounded by the second portion 114, such that the first portion 112 forms an inner part of the clip 110 and the second portion 114 forms an outer part of the dip 110. In other examples, the first portion may be at least partially bounded by the second portion.

Figure 4:
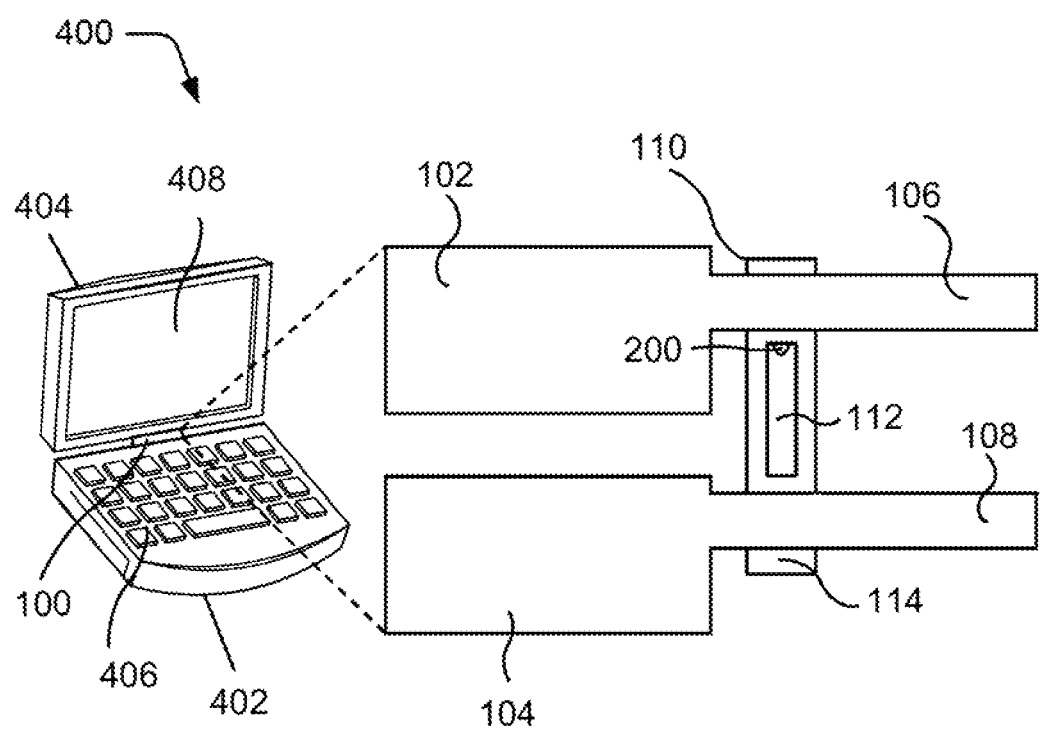
FIG. 4 illustrates a schematic representation of a device with a hinge assembly, in accordance with an example.

FIG. 4 illustrates a schematic representation of a device 400 with the hinge assembly 100, in accordance with an example. Examples of the device 400 include an electronic device, such as a laptop, a foldable tablet, a personal digital assistant (PDA), a foldable e-reader, or the like.

The device 400 includes a base unit 402 and a cover unit 404. In an example, the base unit 402 houses a keyboard 406 or other input component of the device 400. The cover unit 404 houses a display panel 408 for rendering visual content, or other output component of the device 400. In an example, the display panel 408 may be a touch-based display panel capable of receiving touch-based user inputs.

The device 400 includes the hinge assembly 100 coupling the cover unit 404 to the base unit 402. The hinge assembly 100 may be connected between the cover unit 404 and the base unit 402 through screws. In an example, the first hinge element 102 is coupled to the cover unit 404 and the second hinge element 104 is coupled to the base unit 402. In the clip 110, as illustrated in FIG. 4, the first portion 112 is bounded by the second portion 114. In an example, the first portion 112 may be at least partially bounded by the second portion 114. The first portion 112 is similar to the first portion described above in conjunction with FIGS. 1 and 2. The clip 110 also includes the air passage 200 bounded by the first portion 112 and the second portion 110. The air passage 200 is similar to the air passage as described above in conjunction with FIG. 2. Although in FIG. 4, the clip 110 includes a single air passage, in an example, the clip 110 may include multiple air passages similar to the air passage 200.

Although implementations of present subject matter have been described in language specific to structural features and/or methods, it is to be noted that the present subject matter is not necessarily limited to the specific features or methods described. Rather, the specific features and methods are disclosed and explained in the context of a few implementations for the present subject matter.

We claim:

1. A hinge assembly comprising:
   a first hinge element having a first shaft;
   a second hinge element having a second shaft; and
   a clip coupling the first shaft to the second shaft, the clip comprising:
   a first portion formed of a composite material having a pore at a periphery facing a second portion; and
   the second portion formed of a metal, wherein the pore forms an air passage at the periphery between the first portion and the second portion.

2. The hinge assembly as claimed in claim 1, wherein the second portion comprises a first opening and a second opening, and wherein the first shaft passes through the first opening and the second shaft passes through the second opening.

3. The hinge assembly as claimed in claim 1, wherein the composite material is carbon fiber reinforced aluminum.

4. The hinge assembly as claimed in claim 1, wherein the clip has a thermal conductivity ranging between 800 watts per meter-kelvin (W/mK) and 820 W/mK.

5. The hinge assembly as claimed in claim 1, wherein the clip has a tensile strength ranging between 5,000 millipascal (mpa) and 7,000 mpa.

6. A device comprising:
   a base unit;
   a cover unit
   a hinge assembly coupling the cover unit to the base unit, the hinge assembly comprising:
   a first hinge element having a first shaft, the first hinge element being coupled to the cover unit;
   a second hinge element having a second shaft, the second hinge element being coupled to the base unit;
   a clip coupling the first shaft to the second shaft, the clip comprising:
   a first portion formed of carbon fiber reinforced aluminum having a pore at the periphery facing a second portion; and
   the second portion formed of a metal, wherein the pore forms an air passage at a periphery between the first portion and the second portion and the first portion is at least partially bounded by the second portion.

7. The device as claimed in claim 6, wherein the second portion comprises a first opening and a second opening, wherein the first shaft passes through the first opening and the second shaft passes through the second opening.

8. The device as claimed in claim 6, wherein the clip has a density ranging between 2.5 gram per cubic centimeter (g/cm$^3$) and 2.6 g/cm$^3$.

9. The device as claimed in claim 6, wherein the clip has a thermal conductivity ranging between 800 watts per meter-kelvin (W/mK) and 820 W/mK.

10. A device comprising:
    a base unit having an input component;
    a cover unit having an output component; and
    a hinge assembly coupling the cover unit to the base unit, the hinge assembly comprising:
    a first hinge element having a first shaft, the first hinge element being coupled to the cover unit;
    a second hinge element having a second shaft, the second hinge element being coupled to the base unit; and
    a clip coupling the first shaft to the second shaft, the clip comprising:
    a first portion formed of carbon fiber reinforced aluminum having a pore at a periphery facing a second portion; and
    the second portion formed of a metal, wherein the first portion is bounded by the second portion, and the pore forms an air passage at the periphery between the first portion and the second portion, the air passage being bounded by the first portion and the second portion.

11. The device as claimed in claim 10, wherein the second portion comprises a first opening and a second opening, wherein the first shaft passes through the first opening and the second shaft passes through the second opening.

12. The device as claimed in claim 10, wherein the output component is a display unit and the input component is a keyboard.

* * * * *